United States Patent
Schreck et al.

(10) Patent No.: US 7,083,311 B2
(45) Date of Patent: Aug. 1, 2006

(54) CONDUCTOR OF FLEXIBLE MATERIAL, COMPONENT COMPRISING SUCH FLEXIBLE CONDUCTOR, AND METHOD OF MANUFACTURING SUCH CONDUCTOR

(75) Inventors: Wolfgang Schreck, Esslingen (DE); Jochen Scholz, Lorch (DE); Andreas Romberg, Backnang (DE); Christine Weber, Esslingen (DE)

(73) Assignee: Schefenacker Vision Systems Germany GmbH & Co. KG, Esslingen (DE)

( * ) Notice: Subject to any disclaimer, the term of this patent is extended or adjusted under 35 U.S.C. 154(b) by 0 days.

(21) Appl. No.: 10/340,856

(22) Filed: Jan. 10, 2003

(65) Prior Publication Data
US 2004/0253855 A1   Dec. 16, 2004

(30) Foreign Application Priority Data
Jan. 12, 2002  (DE) ............................... 102 00 961
Dec. 20, 2002  (DE) ............................... 102 61 771

(51) Int. Cl.
*B60Q 1/00*   (2006.01)
*B60Q 1/26*   (2006.01)

(52) U.S. Cl. ...................... 362/487; 362/800; 362/488; 362/493; 362/545

(58) Field of Classification Search ................ 362/498, 362/800, 471, 479, 486, 487, 488, 493, 499, 362/501, 545, 544, 547, 249, 345, 373; 174/254, 174/260
See application file for complete search history.

(56) References Cited

U.S. PATENT DOCUMENTS

| | | | | | |
|---|---|---|---|---|---|
| 1,933,965 | A | * | 11/1933 | Carlson | 362/486 |
| 2,997,521 | A | * | 8/1961 | Dahlgren | 174/254 |
| 3,737,655 | A | * | 6/1973 | Blendinger et al. | 200/60 |
| 4,520,562 | A | * | 6/1985 | Sado et al. | 29/878 |
| 4,570,206 | A | * | 2/1986 | Deutsch | 362/103 |
| 4,774,434 | A | * | 9/1988 | Bennion | 313/500 |
| 5,045,141 | A | * | 9/1991 | Salensky et al. | 156/240 |
| 5,130,901 | A | * | 7/1992 | Priesemuth | 362/464 |
| 5,986,613 | A | * | 11/1999 | Weber | 343/713 |
| 6,044,153 | A | * | 3/2000 | Kaschke | 379/433.01 |
| 6,690,616 | B1 | * | 2/2004 | Bahr et al. | 367/99 |

OTHER PUBLICATIONS

Merriam-Webster's Collegiate Dictionary, p. 1220.*
Rosato's Plastic Encyclopedia and Dictionary, copyright 1993, pp. 374-375.*

* cited by examiner

*Primary Examiner*—Sandra O'Shea
*Assistant Examiner*—Sharon Payne
(74) *Attorney, Agent, or Firm*—Gudrun E. Huckett

(57) ABSTRACT

A conductor of flexible material on which electronic or electric components are arranged is embedded at least partially in at least one shape-stable component made of plastic material. The electric or electronic component can be an illuminating device and the shape stable component a reflector. The electric or electronic component can also be a momentary-contact switch or a sensor. The plastic-embedded conductor is produced by mounting the electric or electronic components on the flexible conductor, placing and positionally securing the flexible conductor provided with electric or electronic components into an injection mold, and embedding the flexible conductor at least partially in plastic material by injection molding.

17 Claims, 5 Drawing Sheets

CONDUCTOR OF FLEXIBLE MATERIAL, COMPONENT COMPRISING SUCH FLEXIBLE CONDUCTOR, AND METHOD OF MANUFACTURING SUCH CONDUCTOR

BACKGROUND OF THE INVENTION

The invention relates to a conductor of flexible material on which electronic and/or electric components are provided, a modular component, in particular for motor vehicles, as well as a method for producing such a conductor.

It is known, for example, in connection with light units of motor vehicles to arrange in the light unit housing a reflector that reflects the light emitted by LEDs to the exterior. The LEDs are located on a flexible conductor film. Mounting of the flexible conductor with the LEDs is complex because the LEDs must be arranged at a precise mounting position within the light unit. This is difficult as a result of the flexibility of the conductor.

SUMMARY OF THE INVENTION

It is an object of the invention to configure the conductor, the modular component of the aforementioned kind, and the method of the aforementioned kind such that the flexible conductor can be mounted in a simple way in the desired mounting position.

This object is solved according to the invention for a conductor of the aforementioned kind in that the conductor is embedded at least partially in a shape-stable component, and in regard to the modular component of the aforementioned kind in that the conductor is embedded at least partially in a shape-stable component, and for the method of the aforementioned kind in that the electronic and/or electric component is applied to the flexible conductor, in that the conductor provided with the component is placed into an injection mold and positionally secured, and in that the conductor is at least partially embedded in plastic material.

The flexible conductor according to the invention is at least partially embedded within the shape-stable modular component. By means of this shape-stable modular component, the conductor acquires its shape stability so that it can be mounted without problems in a precise mounting position. Moreover, the conductor is protected in the shape-stable modular component against damage.

In the modular component according to the invention, the flexible conductor is embedded at least partially in the plastic part. Accordingly, when mounting the modular component, the conductor no longer must be mounted separately but forms together with the shape-stable plastic part a modular component which can be mounted simply.

According to the method of the invention, the conductor is provided first with the electronic and/or electric component and subsequently inserted into the injection mold and positionally secured therein. Subsequently, the conductor is at least partially embedded in plastic material. After hardening or solidifying of the plastic material, the partially embedded conductor can be removed from the injection mold.

Further features of the invention result from the additional claims, the description, and the drawings.

BRIEF DESCRIPTION OF THE DRAWINGS

The invention will be explained in more detail with the aid of an embodiment illustrated in the drawings. It is shown in.

DESCRIPTION OF PREFERRED EMBODIMENTS

Figure 1:
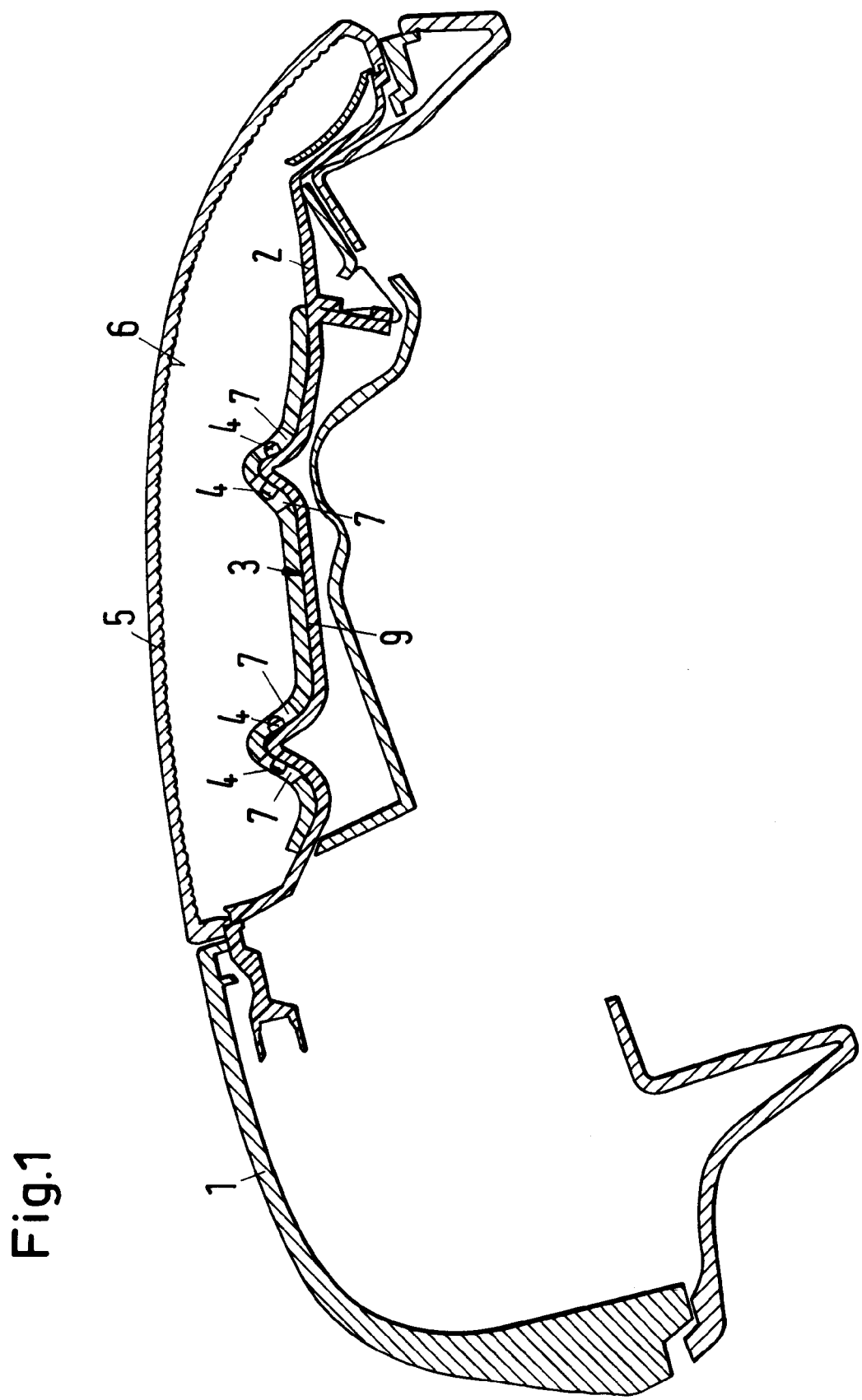
FIG. 1 in a sectional view a part of a lamp unit with a conductor according to the invention.

FIG. 1 shows a lamp unit which is a taillight of a motor vehicle in this embodiment. The lamp unit has a housing 1 in which a carrier 2 is arranged. It is comprised preferably of plastic material but can also be made of any other suitable material. The carrier 2 and a reflector 3 together form a monolithic part. The reflector reflects the rays emitted by the illumination means 4 to a lens 5 through which the light reaches the exterior. The configuration of such a taillight of motor vehicles is known and is therefore not described in more detail. The lens 5 can be provided at its inner side with illumination optics 6.

Figure 2:
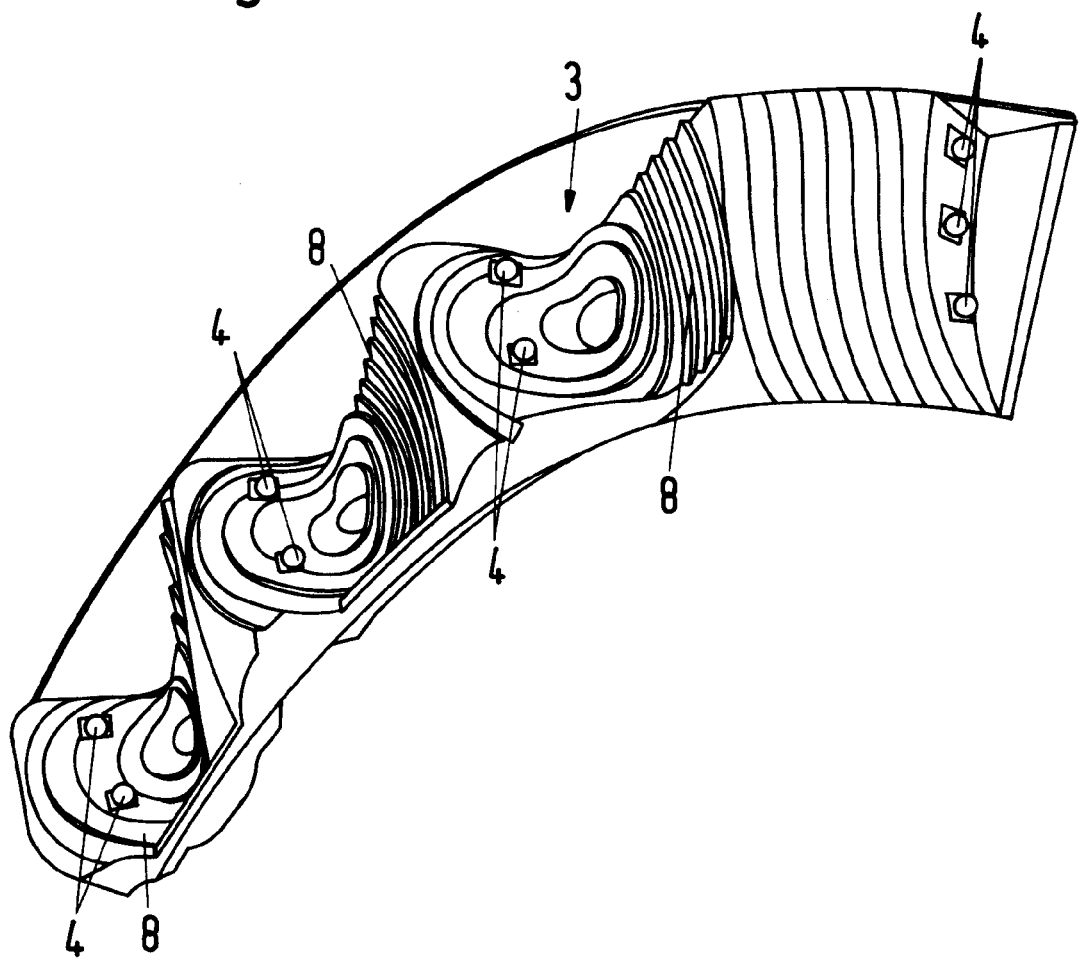
FIG. 2 in a perspective illustration a reflector of the lamp unit according to FIG. 1 provided with the conductor according to the invention.
Figure 3:
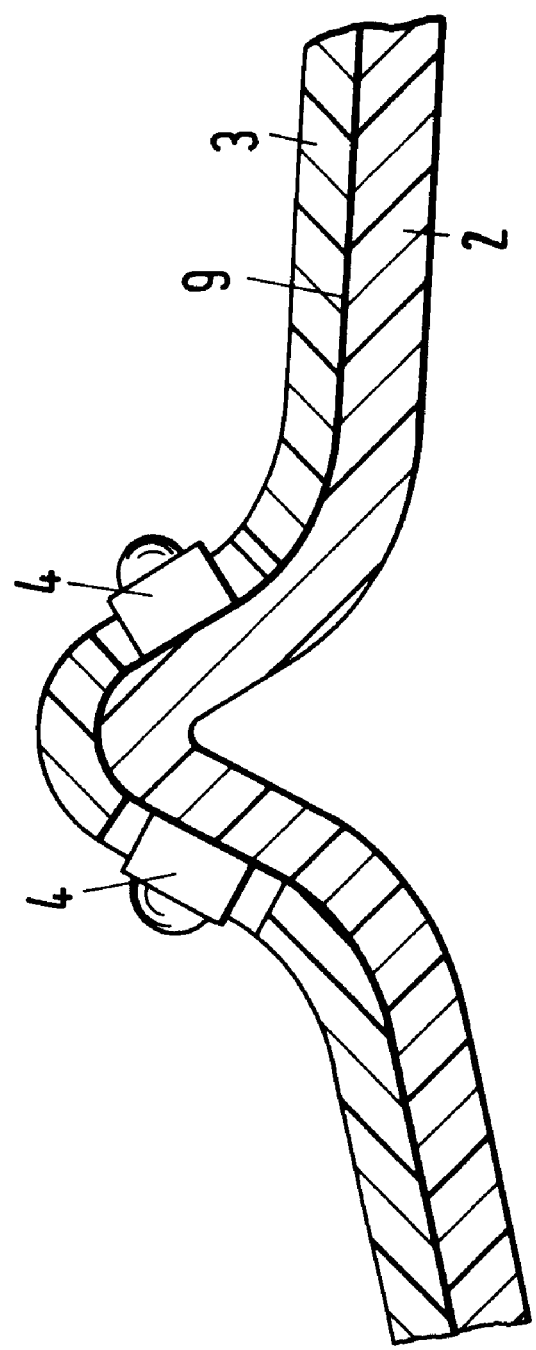
FIG. 3 in a magnified illustration in section a portion of the conductor according to the invention.

The reflector 3 has openings 7 in which the illumination means 4 are positioned. As shown in FIG. 2, the reflector 3 has reflector surfaces 8 for each one of the illumination means 4, respectively. The illumination means 4 are advantageously LEDs mounted on a conductor 9. It is also possible to employ SMD-LEDs as illumination means 4. As shown in FIG. 2, the illumination means 4 in this embodiment are arranged in the area of the reflector surfaces in pairs, respectively. Depending on the configuration of the reflector 3, several such illumination means 4 can be correlated with the corresponding reflector surface 8. Of course, it is also possible to provide for each reflector surface 8 only a single illumination means 4. In the embodiment, there are three additional illumination means 4 provided on the side; they are positioned at a spacing from one another. Advantageously, they are also LEDs and do not radiate through the lens 4 but transversely thereto.

The conductor 9 is a flexible conductor film via which the current supply to the illumination means 4 is realized, as is known in the art. Since the conductor film 9 is flexible, it can be matched to any shape of the carrier 2 and/or of the reflector 3.

Figure 4:
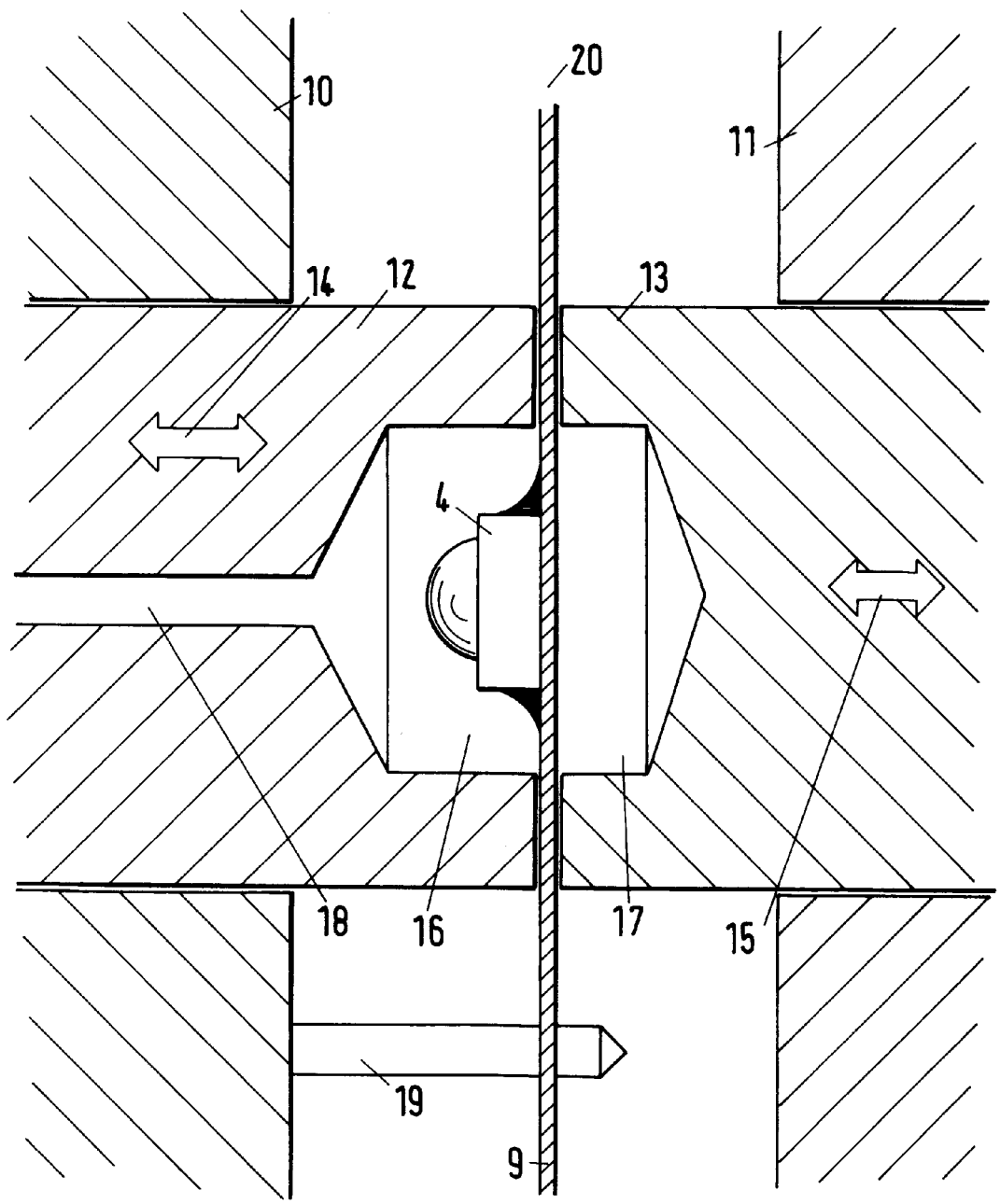
FIG. 4 in section and in a simplified illustration an injection mold for manufacturing the conductor according to the invention.

The carrier 2 and the reflector 3 enclose the conductor 9. When manufacturing the carrier 2 and the reflector 3, the conductor 9 is embedded in the material of these two parts 2, 3. In this way, the conductor 9 is properly secured and protected. FIG. 4 shows schematically a portion of an injection mold. It has two mold parts 10, 11, wherein mold part 10 is stationary and mold part 11 is movable. Both mold parts 10, 11 have at least one securing plunger 12, 13 arranged so as to be movable relative to one another within the mold parts 10, 11. Between them, the flexible conductor 9 is clamped during the injection molding process. The two securing plungers 12, 13 are adjustable in the direction of the double arrows 14, 15 illustrated in FIG. 4. Both securing plungers 12, 13 are configured such that they have at least one cavity 16, 17. The two cavities 16, 17 are positioned opposite one another and form a common cavity divided by the conductor 9. The cavity is configured such that the illumination means 4 mounted on the conductor 9 can be received therein during the injection molding process. The two securing plungers 12, 13 clamp the conductor 9 in the area adjacent to the illumination means 4 such that the plastic material introduced into the injection mold cannot penetrate into the cavity 16, 17.

Depending on the number of illumination means 4 which are mounted on the conductor 9, a corresponding number of securing plungers with corresponding cavities are provided in the injection mold.

A vacuum channel 18 can open into the cavity 16 of one securing plunger 12 via which the cavity can be subjected to vacuum during the injection molding process.

The injection mold can be provided additionally with at least one loading plunger 19.

As is known in the art, the plastic material for the carrier 2 and the reflector 3 is injected into the injection mold. The conductor 9 which is clamped in the cavity 20 between the securing plungers 12, 13 is embedded in this plastic material. The illumination means 4 provided on the conductor 9 are protected during this injection molding process within the cavity 16, 17 of the securing plungers 12, 13. The securing plungers 12, 13 are configured such that they clamp the conductor 9 only in direct vicinity of the illumination means 4 so that in other areas the conductor 9 can be embedded in the plastic material of the carrier 2 and the reflector 3. As a result of the clamping of the conductor 9 by means of the securing plungers 12, 13, it is ensured that the illumination means 4 are in their exact mounting position on the carrier 2 and the reflector 3. The flexible film-like conductor 9 itself must not have a precise mounting position because it is embedded in the plastic material of the carrier 2 and of the reflector 3 and, in this way, is positionally secured. After the injection molding process, the injection mold is opened so that the modular unit comprised of the carrier 2, the reflector 3, and the embedded conductor 9 can be removed and mounted in the housing 1. In this way, the manufacture and assembly of the lamp unit is simple and inexpensive.

The lamp unit can be, for example, a turn signal, a taillight, a headlight, or generally a signal light of a motor vehicle. However, the embedded conductor can also be used for interior and/or instrumentation illumination of motor vehicles, for example, as a dashboard light, cockpit light, a door handle light and the like.

In addition to the illumination means, sensors or other electronic and/or electric components can be mounted on the conductor 9 embedded in the plastic material. In addition to its use in motor vehicles, the embedded conductor 9 can be used also, for example, in cameras, acoustic signaling devices, mobile phones, and the like.

Figure 5:
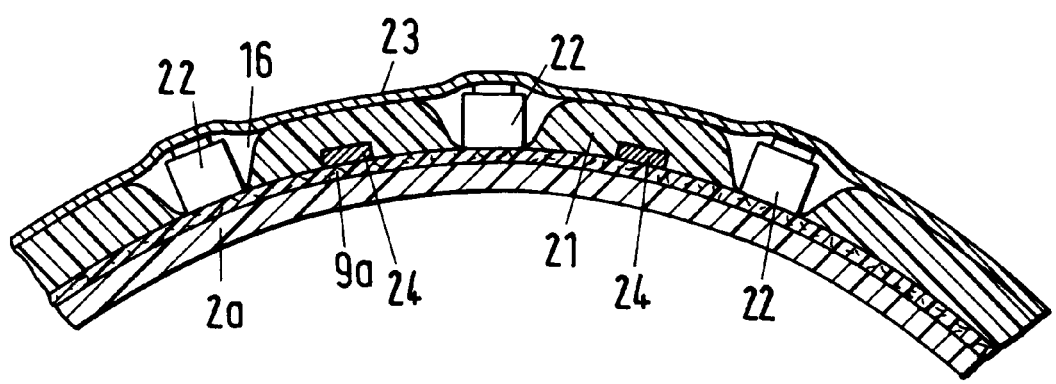
FIG. 5 a further modular component according to the invention in an illustration corresponding to FIG. 3.

FIG. 5 shows a conductor 9*a* on which are provided momentary-contact switches 22 arranged preferably at identical spacing to one another. As in the above described embodiment, the conductor 9*a* is comprised of a flexible film embedded in a carrier 2*a* of shape-stable plastic material. The momentary-contact switches 22 are positioned in cavities 16*a* of a plastic layer 21 applied onto the conductor 9*a*. As described above, it is manufactured in an injection mold with securing plungers 12, 13 between which the conductor film 9*a* with the momentary-contact switches 22 is clamped. The plastic layer 21 has a thickness matched to the height of the momentary-contact switches 22 so that it does not project significantly past the plastic layer 21. It is covered to the exterior by a cover film 23 which also covers the momentary-contact switches 22. The cover film 23 is relatively thin. It is fixedly connected to the plastic layer 21 while resting loosely on the momentary-contact switches 22 in which area it is flexible. Of course, the cover film 23 can also be omitted. In this modular component, the conductor 9*a* is shape-stable and is positive-lockingly and positionally precisely embedded in the carrier 2*a* and the plastic layer 21. The modular component can be produced with a few working steps and of few individual parts in a simple and inexpensive way. The component has only a relatively small size so that it can be mounted in a space-saving way. Electric/electronic components 24 are embedded in the plastic layer 21 which are seated on the conductor 9*a* and are required for operating the momentary-contact switches 22. Via the flexible area of the cover film 23, the momentary-contact switches 22 can be actuated properly. The momentary-contact switches 22 can be, for example, part of a mobile phone, an operating unit, and the like.

Instead of the momentary-contact switches 22, it is also possible to employ sensors, for example, ultrasound sensors as a parking assistant in motor vehicles, sensors for monitoring the interior of motor vehicles, rain sensors, and the like. Since the component is very flat, it can be used, in particular, in the automobile sector, for example, as an operating unit for a roof module, in a bumper as a parking assistant, or in connection with sensors for the interior and exterior areas.

Since the conductors 9, 9*a* are embedded in plastic material, an optimal heat distribution and heat dissipation result. Additional measures for heat distribution or heat dissipation are therefore not required.

The plastic material for the carrier 2 or 2*a* and/or the reflector 3 can be thermoplastic materials, such as polycarbonate, acrylonitrile butadiene styrene copolymers (ABS), polybutylene terephthalate (PBT), polyamide and similar materials. Thermoplastic materials have a relatively low melting point so that, when injection molding the carrier 2, 2a and the reflector 3, there is no risk of damaging the electric and/or electronic components 4 or 22 arranged on the conductor 9, 9*a*.

Additives, for example, mineral substances, glass, flour, fibers, ceramics, and the like, can be admixed to the plastic material for improving heat dissipation. These additives can be present in amounts of up to 60% by weight.

The invention claimed is:

1. A modular component for motor vehicles, comprising:
   at least one flexible conductor film having a first face and a second face opposite the first face;
   at least one illumination means arranged on the at least one flexible conductor film and supplied with electric current through the at least one flexible conductor film;
   a carrier arranged on the first face;
   a reflector arranged on the second face of the at least one flexible conductor film opposite the carrier, wherein the carrier and the reflector form a single monolithic shape-stable plastic part embedding the at least one flexible conductor film;
   wherein the at least one illumination means is arranged in an opening of the reflector.

2. The modular component according to claim 1, wherein the illumination means is an LED or an SMD.

3. The modular component according to claim 1, wherein the plastic part has a greater thickness than at least one of the carrier and the at least one conductor film.

4. The modular component according to claim 1, wherein the modular component is a part of a light unit of the motor vehicle.

5. The modular component according to claim 1, wherein the plastic part is comprised of at least one thermoplastic material.

6. The modular component according to claim 5, wherein the at least one thermoplastic material contains additives.

7. The modular component according to claim 6, wherein the additives are present in the at least one thermoplastic material in an amount of up to approximately 60% by weight.

8. The modular component according to claim 6, wherein the additives are comprised of heat-dissipating material.

9. The modular component according to claim 6, wherein the additives are mineral substances, fibers, or ceramics.

10. A modular component for motor vehicles, comprising:
at least one flexible conductor film having a first face and a second face opposite the first face;
momentary contact switches arranged on the at least one flexible conductor film and supplied with electric current through the at least one flexible conductor film;
a carrier arranged on the first face;
a plastic layer arranged on the second face of the at least one flexible conductor film, wherein the carrier and the plastic layer form a single monolithic shape-stable plastic part embedding the at least one flexible conductor film;
wherein the momentary contact switches are arranged in cavities of the plastic layer.

11. The modular component according to claim 10, wherein the modular component is a keypad of a mobile phone.

12. The modular component according to claim 10, wherein the modular component is an operating unit for a roof module of the motor vehicle.

13. The modular component according to claim 10, wherein the plastic part is comprised of at least one thermoplastic material.

14. The modular component according to claim 13, wherein the at least one thermoplastic material contains additives.

15. The modular component according to claim 14, wherein the additives are present in the at least one thermoplastic material in an amount of up to approximately 60% by weight.

16. The modular component according to claim 14, wherein the additives are comprised of heat-dissipating material.

17. The modular component according to claim 14, wherein the additives are mineral substances, fibers, or ceramics.

* * * * *